| (12) | United States Patent | (10) Patent No.: | US 8,546,768 B2 |
|---|---|---|---|
| | Gierak et al. | (45) Date of Patent: | Oct. 1, 2013 |

(54) DEVICE FOR GENERATING AN ION BEAM WITH MAGNETIC FILTER

(75) Inventors: Jacques Gierak, Le Plessis Pate (FR); Ralf Jede, Allemagne (DE)

(73) Assignee: Centre National de la Recherche Scientifique (C.N.R.S.), Paris (FR)

( * ) Notice: Subject to any disclaimer, the term of this patent is extended or adjusted under 35 U.S.C. 154(b) by 30 days.

(21) Appl. No.: 13/063,749

(22) PCT Filed: Sep. 14, 2009

(86) PCT No.: PCT/FR2009/051719
§ 371 (c)(1),
(2), (4) Date: Sep. 2, 2011

(87) PCT Pub. No.: WO2010/029269
PCT Pub. Date: Mar. 18, 2010

(65) Prior Publication Data
US 2011/0309264 A1    Dec. 22, 2011

(30) Foreign Application Priority Data

Sep. 15, 2008 (FR) ..................................... 08 56189
Sep. 15, 2008 (FR) ..................................... 08 56190

(51) Int. Cl.
*H01J 40/00* (2006.01)
*H01J 47/00* (2006.01)

(52) U.S. Cl.
USPC .......... 250/396 ML; 250/492.21; 250/423 R; 250/296

(58) Field of Classification Search
USPC .................. 250/296, 396 ML, 492.1, 492.21, 250/423 R
See application file for complete search history.

(56) References Cited

U.S. PATENT DOCUMENTS

| 4,272,699 A | | 6/1981 | Faubel et al. | |
|---|---|---|---|---|
| 4,782,235 A | * | 11/1988 | Lejeune et al. | ........... 250/423 R |
| 5,055,696 A | * | 10/1991 | Haraichi et al. | ........... 250/492.2 |
| 5,198,677 A | * | 3/1993 | Leung et al. | .................. 250/424 |
| 5,288,386 A | * | 2/1994 | Yanagi et al. | ............. 204/298.16 |
| 5,365,070 A | * | 11/1994 | Anderson et al. | ......... 250/423 R |
| 5,504,340 A | * | 4/1996 | Mizumura et al. | ....... 250/492.21 |
| 5,563,418 A | * | 10/1996 | Leung | ...................... 250/492.21 |

(Continued)

FOREIGN PATENT DOCUMENTS

| JP | 60133635 | 7/1985 |
|---|---|---|
| WO | WO 02/078036 | 10/2002 |

OTHER PUBLICATIONS

Ka-Ngo Leung, The Application and Status of the Radio Frequency Driven Multi-Cusp Ion Source (Invited), Review of Scientific Instruments, vol. 71, No. 2, Feb. 2000, pp. 1064-1068.

(Continued)

*Primary Examiner* — David A Vanore
(74) *Attorney, Agent, or Firm* — Patterson & Sheridan, LLP

(57) ABSTRACT

A device for generating an ion beam includes a support; a liquid metal ion source connected to the support at the lower end of the ion source and surrounded by a cryogenic trap which is capable of preventing volatile chemicals from reaching the ion source; an ion extraction means for extracting the ions emitted by the source through an opening disposed near the upper end of the ion source; and means for generating a magnetic field in the opening of the extraction means, the generated magnetic field capable of preventing charged particles from reaching the ion source.

21 Claims, 4 Drawing Sheets

(56) References Cited

U.S. PATENT DOCUMENTS

| | | | |
|---|---|---|---|
| 5,583,344 A * | 12/1996 | Mizumura et al. | 250/492.21 |
| 5,760,405 A * | 6/1998 | King et al. | 250/423 R |
| 5,825,035 A * | 10/1998 | Mizumura et al. | 250/423 R |
| 6,294,862 B1 * | 9/2001 | Brailove et al. | 313/363.1 |
| 6,777,699 B1 * | 8/2004 | Miley et al. | 250/492.3 |
| 6,797,968 B2 * | 9/2004 | Tsukihara et al. | 250/492.21 |
| 6,803,585 B2 * | 10/2004 | Glukhoy | 250/423 R |
| 7,911,120 B2 * | 3/2011 | Lacoste et al. | 313/231.31 |
| 7,943,913 B2 * | 5/2011 | Balakin | 250/492.3 |
| 8,283,629 B1 * | 10/2012 | Tuggle et al. | 250/305 |
| 8,294,093 B1 * | 10/2012 | Tuggle et al. | 250/296 |
| 2010/0243879 A1 * | 9/2010 | Huang et al. | 250/281 |
| 2011/0309264 A1 * | 12/2011 | Gierak et al. | 250/398 |
| 2012/0018648 A1 * | 1/2012 | Gierak et al. | 250/396 R |
| 2012/0267546 A1 * | 10/2012 | Reynolds et al. | 250/423 R |

OTHER PUBLICATIONS

Jon Orloff, Focused Ion Beams, Liquid-Metal Sources, Their Conical Shape Generated by Electrostatic Fields, Produce Charged Atoms That Can Cut Away and Rebuild Circuits on a Microscopic Scale, Scientific American, Oct. 1991, pp. 74-79.

PCT International Search Report for International Application No. PCT/FR2009/051719 dated Jan. 15, 2010.

* cited by examiner

DEVICE FOR GENERATING AN ION BEAM WITH MAGNETIC FILTER

The present invention concerns a device for generating an ion beam, comprising: a support; an ion source, this ion source having a lower end connected to the support and an upper end, opposite the lower end; and means for extracting the ions emitted by the source, this extraction means comprising a wall provided with an opening, the opening being arranged in the vicinity of the upper end of the ion source, to allow the extracted ions to pass through this opening.

Such a device for generating an ion beam is known from document WO 02/078036 A2.

It has been ascertained that the spatial and temporal stability of the ion beam emitted by a said device is limited. Contamination effects, notably due to bombarding by secondary electrons such as described in the article by P. Sudraud et al (1986), The effect of carbon bearing gases and secondary electron bombardment on a liquid metal ion source, Journal de Physique, C7, Tome 47, 381, are detrimental to the stability of the ion source. These contamination effects considerably increase the noise of the ion source and reduce the lifetime thereof.

It is therefore one objective of the invention to improve the spatial and temporal stability of the ion beam emitted by a device such as set forth above.

This objective is reached with a device for generating an ion beam of the above-cited type, characterized in that the device further comprises means for the generation of a magnetic field capable of generating a magnetic field at the opening of the extraction means, the generated magnetic field being capable of deflecting the charged particles attracted by the ion source so that these charged particles do not reach the ion source.

By generating a magnetic field at the opening of the extraction means, it becomes possible to deflect the secondary electrons from their pathway. The secondary electrons are no longer able to reach the ion source, and therefore can no longer perturb the ion-emitting region of this source. Therefore, the stability of the device for generating an ion beam is markedly improved, making it possible to obtain linearity of its IN characteristics that is noteworthy and of no comparison with an equivalent device whose source is not protected by a magnetic field.

The protection of the ion source by a magnetic field also allows an increase in the lifetime thereof.

Document U.S. Pat. No. 6,294,862 describes an ion source using phosphine gas as <<fuel>>, i.e. as input species to be ionized. Phosphine gas is added to a confinement chamber and is ionized therein by electron bombardment. The resulting plasma is contained within the chamber by means of magnets distributed over the walls thereof. The phosphorous cations contained in the plasma exit the chamber in the form of a beam through openings made in a plasma electrode arranged at one of the walls of the confinement chamber. Yet, it occurs that among the electrons present in the plasma and used to ionize the phosphine gas, those that are of high energy manage to exit the confinement chamber together with the phosphorous cations, via said openings and <<pollute>> the ion beam. To reduce the quantity of undesirable high energy electrons present in the ion beam, document U.S. Pat. No. 6,294,862, proposes arranging magnets around openings in the plasma electrode. The magnetic field set up at the openings of the plasma electrode turn the high energy electrons away from said openings. Therefore, the high energy electrons are kept inside the confinement chamber. In addition, the plasma electrode is held at a slightly negative potential compared with the remainder of the confinement chamber so as to repel plasma anions back into the confinement space. The plasma electrode, including its magnets, is therefore used solely for confinement of the plasma. The extracting of phosphorous cations through the openings of the plasma electrode is ensured by a component separate from the plasma electrode, namely an ordinary extraction electrode located downstream of the ion source.

Depending on particular embodiments, the device for generating an ion beam according to the invention comprises one or more of the following characteristics, taken alone or in any technically possible combination:

The generated magnetic field is capable of deflecting the charged particles so that they meet the wall of the extraction means instead of reaching the ion source by passing through the opening of the extraction means;

The means for generating a magnetic field is arranged at the opening of the extraction means;

The opening of the extraction means is formed in a recess of the extraction means, the means for generating a magnetic field being positioned inside this recess, on the edge of said opening;

The means for generating a magnetic field comprise at least one permanent magnet;

The means for generating a magnetic field comprise two permanent magnets placed facing one another;

The two permanent magnets together define an air gap that is preferably adjustable by about 2 to about 4 mm;

The magnetic field induced by the two permanent magnets in the air gap is of the order of 0.1 to 1 Tesla;

The ion extracting means is an extraction electrode surrounding the ion source;

The ion source is surrounded by a cryogenic trap held at low temperature, this cryogenic trap being capable of trapping volatile chemical species by condensation before they are able to reach the ion source;

The cryogenic trap is held at low temperature by:
circulation or accumulation of a cryogenic fluid, the cryogenic fluid preferably being liquid nitrogen; or
a mechanical refrigerator generating low vibration emission; or
an electric refrigerator;

The cryogenic trap is held at a temperature of less than 100 K;

The cryogenic trap comprises a sheath with two open ends surrounding the ion source;

The cryogenic trap comprises a coiled tube of cryogenic fluid wound around the sheath;

One of the open ends of the sheath is used for passing of the ion beam produced by the ion source;

The sheath is formed of a wall of revolution, this wall comprising a first section of cylindrical shape and a second of frusto-conical shape;

The cryogenic trap surrounds both the ion source and the extraction means;

The ion source is a liquid metal ion source;

The liquid metal ion source comprises a conductive rod ending in a tip, a reservoir attached to the rod and used to collect a source metal to be liquefied, and a conductive filament comprising windings through which the tip of the rod passes.

The invention additionally comprises a focused ion beam installation comprising:
a work chamber containing a sample holder and an inlet for reagent gases in the vicinity of the sample holder; and a column with several levels, of which a first level for generating the ion beam and a second level for guiding and focusing the ion beam, an installation in which the first level comprises a device for generating an ion beam such as set forth above.

The invention will be better understood on reading the following description, given solely as an example and with reference to the appended drawings.

Figure 1:
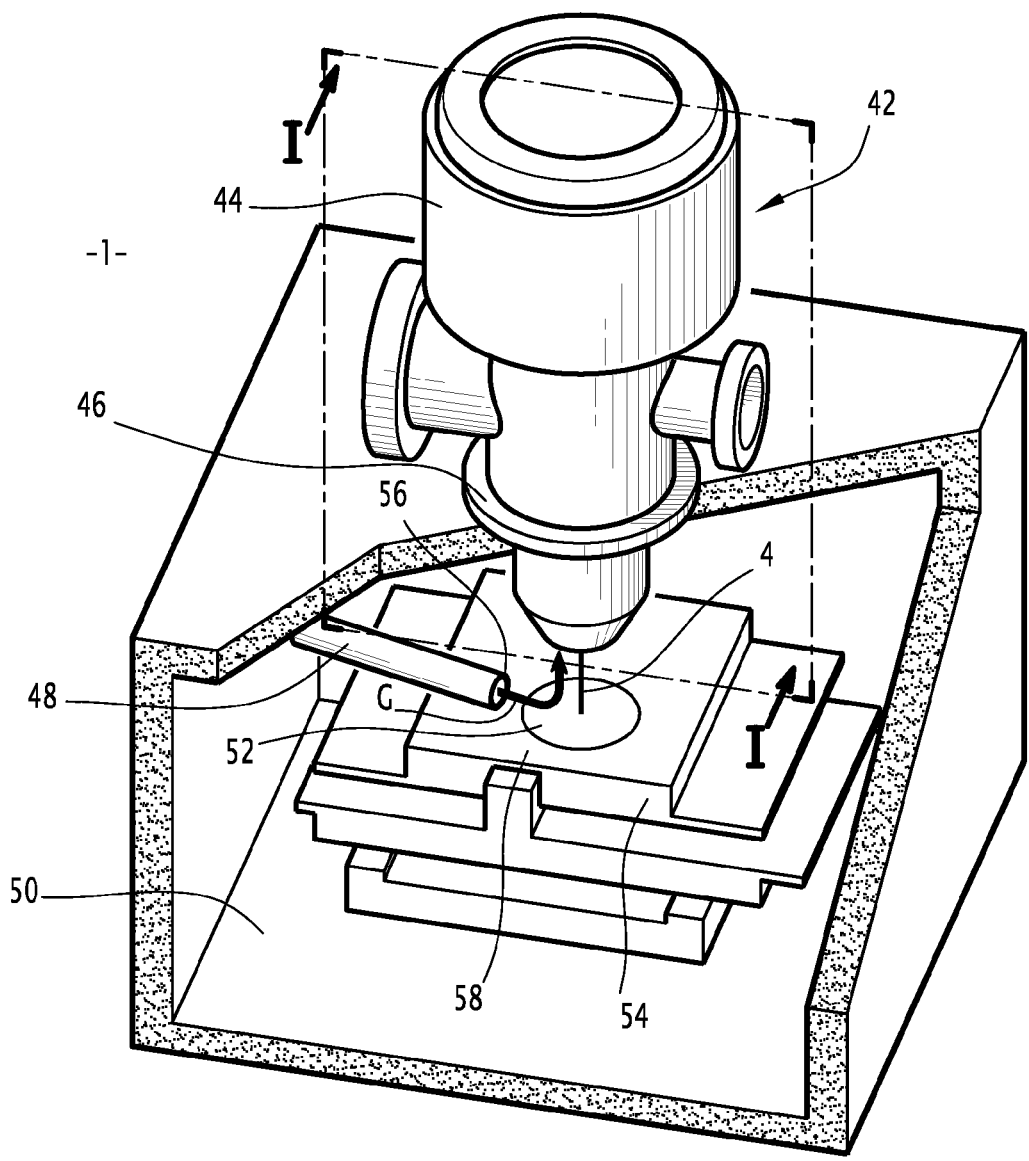
FIG. 1 is a perspective cutaway view of a focused ion beam installation according to one embodiment of the invention.

FIG. 1 illustrates a focused ion beam installation according to the invention. This installation 1 comprises a work chamber 50 of parallelepiped shape held under a vacuum, and a column 42 of general cylindrical shape. The column 42 passes through one of the walls of the work chamber 50 and one end thereof extends into the chamber.

The column 42 has several levels and notably a first level 44 containing a device 2 for generating an ion beam (cf. FIG. 3), and a second level 46 containing means for guiding and focusing the ion beam generated inside the first level.

The work chamber 50 contains a holder 54 which is used to hold and position a sample 52 with three-dimensional nanometric precision. For this purpose, the holder 54 preferably comprises a laser interferometer.

In addition, the work chamber 50 contains a gas inlet 48, whose orifice 56 lies in the vicinity of the work region 58 of the holder 54 able to receive a sample 52.

Figure 2:
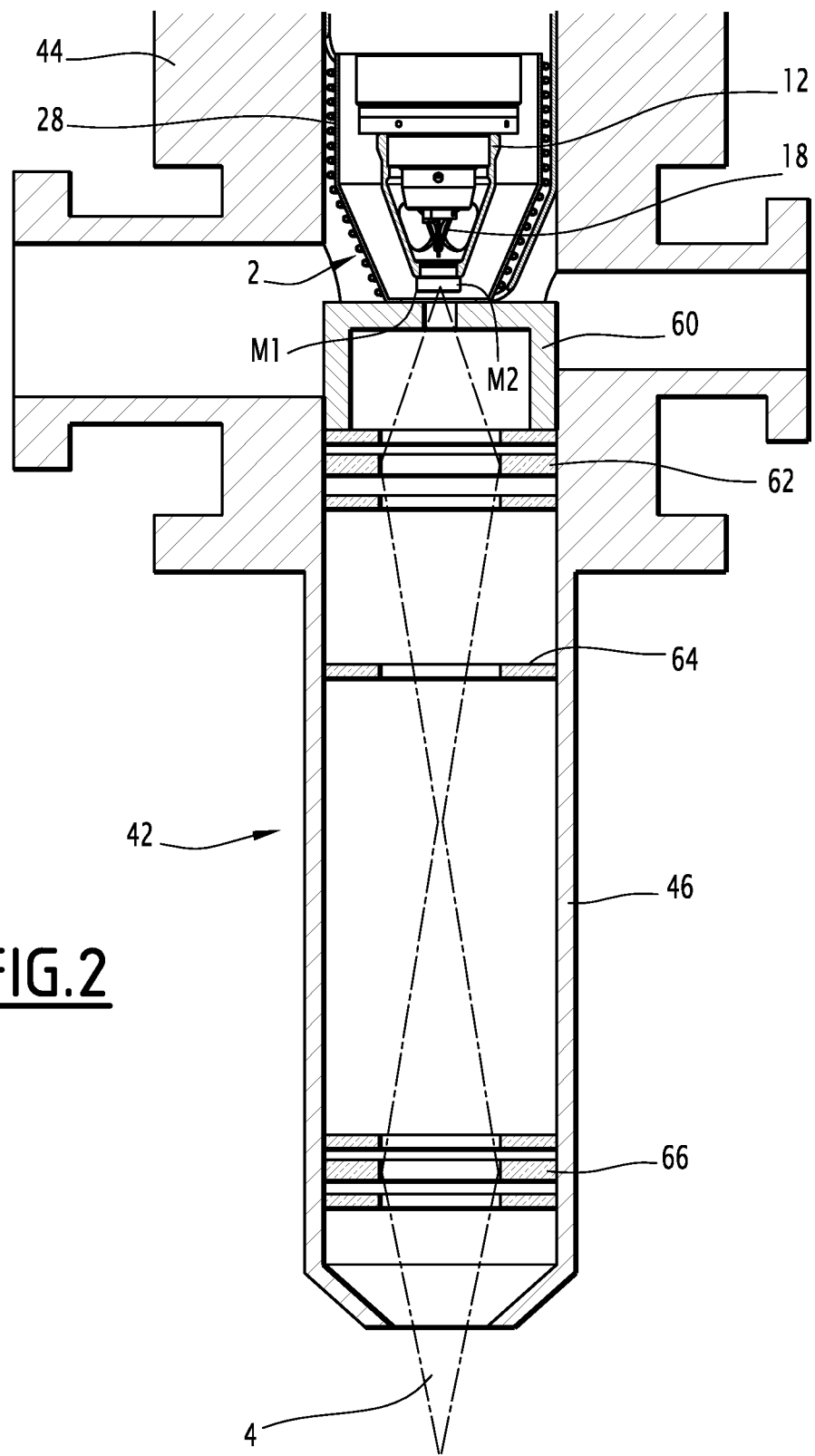
FIG. 2 is a longitudinal, sectional view of the column of the installation in FIG. 1, along arrows I-I.

FIG. 2 gives a schematic overview of the main elements present inside the column 42. From top to bottom, these are the ion source 18, the extraction electrode 12, the accelerator 60, a first lens 62, a diaphragm 64 and a second lens 66.

Figure 3:
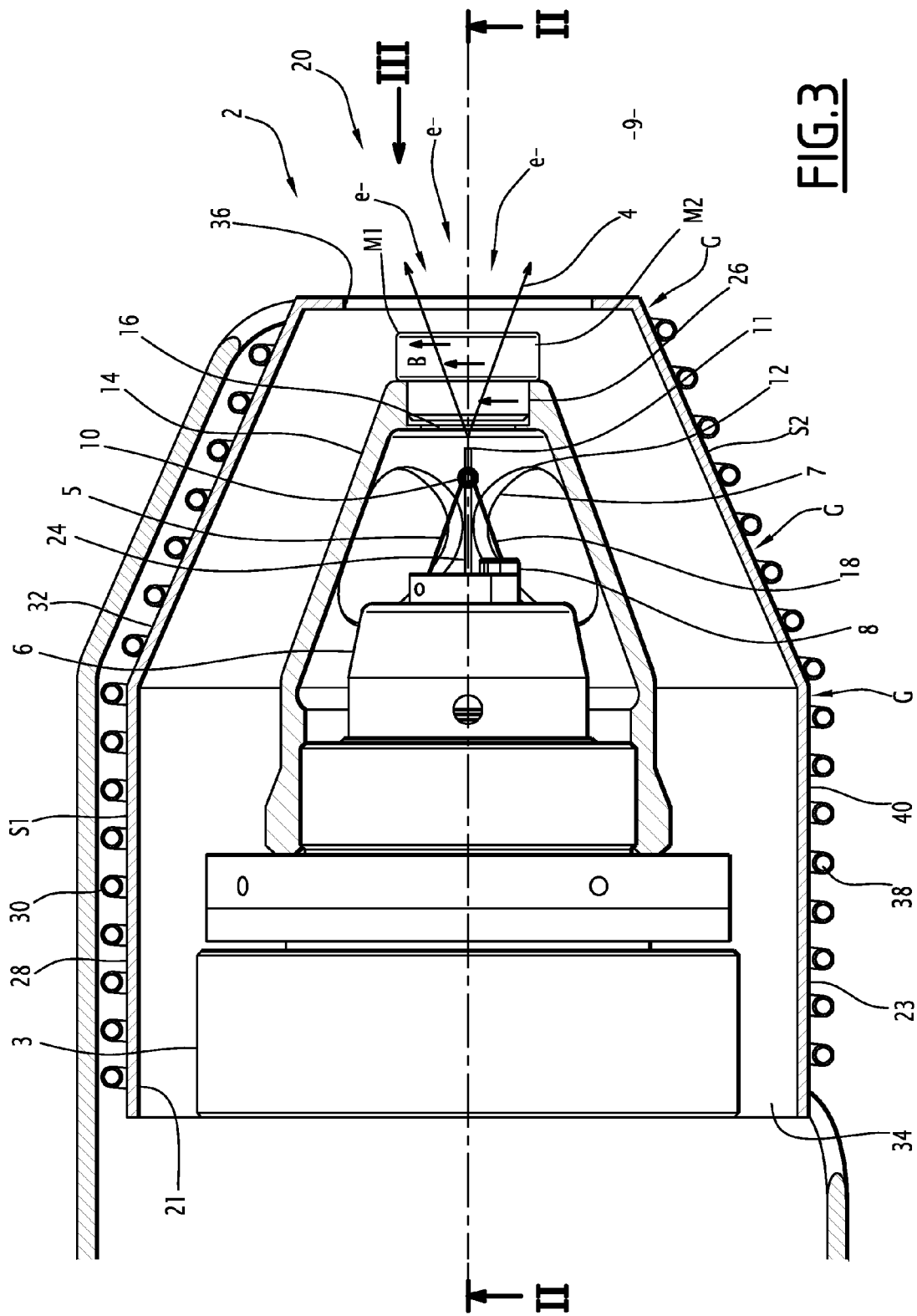
FIG. 3 is partial, cross-sectional side view of the device for generating an ion beam integrated in the installation shown FIG. 1.

FIG. 3 illustrates a device for generating an ion beam, this device being designated under reference number 2. This device 2 is positioned inside a space 9 of the first level 44, the space being held under a vacuum. The device 2 comprises an ion source 18 which is surrounded by an extraction electrode 12. The ion source 18 and the extraction electrode 12 are attached to a support 6. A base 3 can also be seen on which the support 6 is mounted.

The source 18 comprises a conductive rod 24 ending in a tip 11, a reservoir R (cf. FIG. 4) secured to the rod 24 and used to collect a source metal to be liquefied, and a conductive filament 5 comprising windings. The tip 11 of the rod 24 passes through these windings. The rod 24 and the reservoir R are formed of a conductive, refractory material such as graphite or tungsten. The source metal is a material of high purity and is incorporated in the ion source 18 before use thereof.

The expression <<lower end>> will be used to designate the end 8 of the ion source 18 located in the vicinity of the support 6. The end 10 of the ion source 18 opposite the lower end 8 shall be designated the <<upper end>>. This upper end 10 comprises the tip 11 of the rod 24.

The extraction electrode 12 is provided with an opening 16, called the <<extraction diaphragm>>, and with orifices such as orifice 7 through which residual gases can be pumped. The opening 16 and said orifices are made in a wall 14 of the extraction electrode 12. The opening 16 is located in the middle of a cylindrical recess 26 of the extraction electrode 12.

The characteristics of the device 2 just described are known, and for further details reference can be made to documents WO 02/078036 A2 and WO 96/02065. In the remainder hereof we shall focus on new elements that are subject of the present invention.

The device 2 has the particularity of comprising a cryogenic trap 28. The trap 28 must lie at a sufficient distance from the ion source 18 to avoid cooling of the source metal. This trap 28 comprises a sheath 32 surrounding the ion source 18, and an extraction electrode 12. The sheath 32 has a section S1 of cylindrical shape and a section S2 of frusto-conical shape. The wall of revolution 40 of the sheath 32 forms a shield around the ion source 18. The inner surface 21 of the wall 40 can be distinguished, this surface facing the ion source 18, and the outer surface 23 of the wall 40 which faces the space 9. In other words, the outer surface 23 is located on one side of the wall 40, whilst the ion source 18 is located on the other side of the wall 40.

The sheath 32 has two open ends 34 and 36. The open end 34 allows inserting of the ion source 18 and of the extraction electrode 12 inside the sheath 32. The open end 36 allows the passing of the ion beam 4 generated by the ion source 18.

The cryogenic trap 28 further comprises a coiled tube 38 wound around the sheath 32. This tube 38 allows the circulation or accumulation of a cryogenic fluid 30, preferably liquid nitrogen.

A second novelty of the device 2 is the addition of a magnetic filter M1, M2. This magnetic filter comprises two permanent magnets M1 and M2 which are arranged facing one another inside the recess 26 of the extraction electrode 12.

Figure 4:
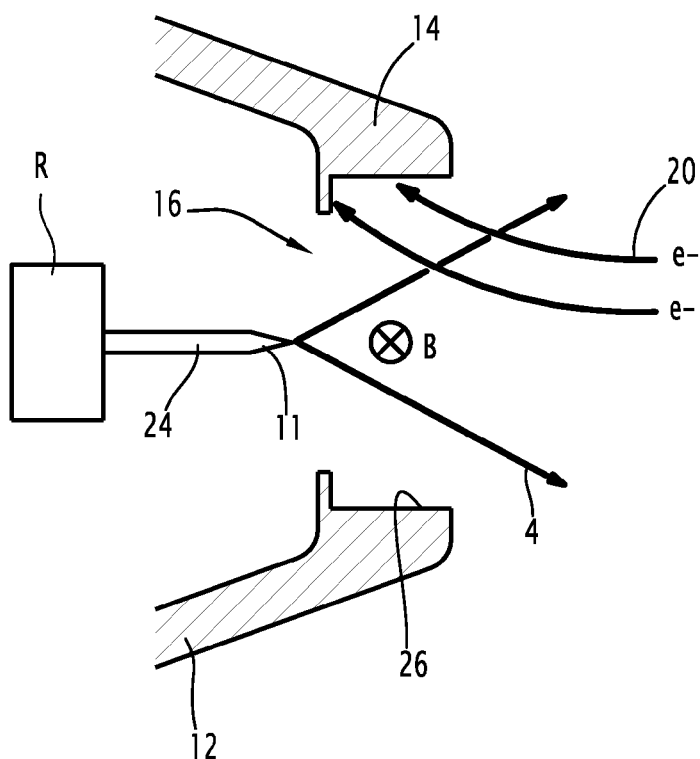
FIG. 4 is a cross-sectional view of a detail in FIG. 3, along arrows II-II.
Figure 5:
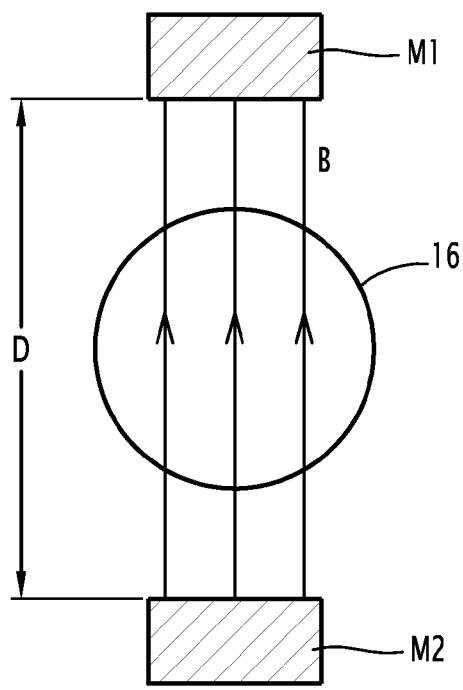
FIG. 5 is a front view of the emission opening of the device in FIG. 3, along arrow III.

With reference to FIG. 5, these two magnets together define an air gap D. This air gap D is preferably adjustable between about 2 and 4 mm. The two magnets M1 and M2 induce a magnetic field B in the air gap D, the value of this field preferably being of the order of 0.1 to 1 Tesla. The magnetic field B is represented FIGS. 3 to 5 by arrowed field lines.

FIG. 4 is a cross-sectional view of the tip of the extraction electrode 12, along line II-II in FIG. 3. FIG. 4 therefore illustrates a view perpendicular to the view shown FIG. 3. In FIG. 4, the magnetic field B can be seen whose field lines lie perpendicular to the plane of the drawing. The tip 11 can also be seen of the conductive rod 24 which emits the ion beam 4. The magnets M1 and M2 cannot be seen in FIG. 4 since they respectively lie behind and in front of the plane of the drawing.

The ion source 18 is a liquid metal ion source commonly abbreviated to <<LMIS>>. Said LMIS is capable of generating a beam of metal ions, e.g. a beam of gallium or aluminium ions. More precisely, a current is passed through the conductive filament 5 which, by Joule effect, heats the reservoir R of metal and the rod 24. The source metal present in the reservoir R is therefore liquefied and spreads over the surface of the rod 24 and notably over the tip 11. The extraction electrode 12 pulls metal ions away from the layer of liquid metal covering the apex of the tip 11.

The metal ions that are pulled away are attracted by the extraction electrode 12 and pass through the opening 16. They exit the device 2 and then the first level 44 in the form of a beam 4. The beam of ions 4 reaches the second level 46 where it is guided and focused onto a sample 52 located inside the work chamber 50. Treatment of the surface of the sample 52 by the beam 4 occurs by moving the sample holder 54. The ion beam 4 can be qualified as a primary beam, and the products induced by use of the beam 4 on the sample 52 as secondary by-products.

The cryogenic trap 28 was added to the device 2 to make it compatible with gas injection techniques frequently used in industrial applications of ion generating devices. These injection techniques consist of adding reagent gases or precursor gases to the work chamber 50 by means of one or more gas inlets such as inlet 48, in order to diversify or to improve and accelerate the treatment of the samples 52 by the ion beam 4.

A first of these techniques is deployed when the ion beam 4 is used to etch a sample. Reagent gases are fed via the inlet 48 and exit the latter in direction of the sample 52. The gases react with the atoms of the sample 52 sputtered by the beam 4, forming volatile compounds. The volatile compounds are evacuated by the pumping system of the work chamber 50. This process improves the speed of etching since it neutralizes and evacuates the debris from etching.

The injection technique is also used to deposit substances on a sample. For this purpose, precursor gases are added via inlet 48 into the work chamber 50, and their molecules are separated under the action of the ion beam 4. The non-volatile compounds from this reaction then form a solid deposit adhering to the surface of the sample 52.

Within the context of a liquid metal ion source, these injection techniques have a major disadvantage. The gases injected into the work chamber 50 diffuse inside the chamber and enter into the column 42. On account of a favourable pressure gradient (the vacuum inside the first level 44 is higher than the vacuum inside the work chamber 50), these gases are conveyed as far as the source 18 and interact with the liquid metal.

These interactions have extremely harmful effects on the ion source 18 and cause destabilising thereof. It therefore becomes impossible to maintain the stability of ion emission over periods of several hours.

The cryogenic trap 28 allows the solving of this problem by protecting the ion source 18 against vapours of injected gas. The liquid source metal is therefore preserved. Through its cryogenic trap, the device 2 for generating an ion beam is compatible with gas injection techniques.

The cryogenic trap 28 operates in the following manner. Liquid nitrogen 30 is caused to circulate inside the tube 38 to cool the wall 40 of the sheath 32 down to a temperature below 100 K. The sheath 32 thus cooled forms a trap for the vapours of injected gas G which are illustrated in FIGS. 1 and 3 by curved arrows. These volatile species G enter into the column 42, pass through the second level 46 and reach the first level 44 where they spread out into the space 9 surrounding the ion beam generating device 2. The vapours G are halted on their pathway towards the ion source 18 by the outer surface 23 of the wall 40 which forms a barrier. Once stopped by the outer surface 23, the species G are rapidly cooled and therefore lose a large part of their kinetic energy. The species G are condensed on the outer surface 23 and are truly <<trapped>>. Through lack of energy, they remain <<glued>> to the cryogenic trap 28 and therefore can no longer reach the ion source 18.

According to one variant of the invention, the cryogenic trap, as cooling means, comprises a cryogenerator/mechanical refrigerator or an electric refrigerator, preferably a device with so-called <<Peltier>> effect, instead of a cryogenic fluid.

The magnetic filter M1, M2 was added to the device 2 to prevent the secondary electrons 20 (cf. FIGS. 3 and 4) from reaching the ion source 18. These secondary electrons 20 are created by the impact of ions from the ion beam 4 on the walls surrounding the device 2. They are attracted by the local electric field of high intensity prevailing around the tip 11. If there is no magnetic field B, the secondary electrons 20 enter inside the extraction electrode 12 via opening 16 and contaminate the ion source 18.

By means of the magnetic field B at the opening 16, the secondary electrons 20 are deflected from their pathway, as can be seen FIG. 4, and are intercepted by the wall 14 of the extraction electrode 12 itself generating an attractor electrostatic field. The secondary electrons 20 are thereby neutralized. The magnetic filter M1, M2 therefore protects the liquid metal of the ion source 18 from the secondary electrons.

On the other hand, the influence of the magnetic field B on the pathway of the metal ions emanating from the tip 11 of the rod 24 and passing through the opening 16 is negligible. The metal ions effectively have a much higher mass and kinetic energy than the secondary electrons. Therefore, even in the presence of the magnetic field B, the pathway of the metal ions remains essentially unchanged.

It is to be noted that the magnetic filter according to the invention can also assume forms other than those just described. Indeed, to attain the desired objective, any means may be sufficient provided they are capable of generating a magnetic field adapted to prevent the secondary electrons from reaching the ion source 18.

The device for generating an ion beam according to the invention particularly has the following advantages:
- more stable operation of the ion source at low emission current (<3 µA) through elimination of the current of secondary electrons striking the emitting tip;
- increased lifetime of the source;
- improved purity of the emitted ion beam, through increased protection of the source; and
- the obtaining of a more efficient pumping effect in the region of the ion source allowing the source, in emission, to be maintained under a high vacuum (10-8 mbar) thereby <<erasing>> the influence of vacuum fluctuations related to sample loading and unloading operations, which can therefore be multiplied at will without damaging the ion source which can be left in operation.

To summarize, this device allows the integrity of the ion source to be preserved, and hence allows spacing of the number and frequency of (i) decontamination operations generally conducted by heating the source, which require interrupted use, involve further adjustment of the instrument and lead to loss of liquid metal through evaporation and of (ii) replacements of sources which have reached the end of their lifetime.

With the invention the productivity of the device can be improved, since the user is able to maintain operational settings (optical centring of the ion source in relation to the electrostatic optical system, focusing and correction of residual astigmatism of the beam) over considerably longer periods.

The invention claimed is:

1. A device for generating an ion beam, comprising:
a support;
a liquid metal ion source, comprising one lower end connected to the support and an upper end opposite the lower end;
means for extracting the ions emitted by the source, this extraction means comprising a wall provided with an opening, the opening being arranged in the vicinity of the upper end of the ion source, to allow the extracted ions to pass through this opening; and
means for the generation of a magnetic field capable of generating a magnetic field at the opening of the extraction means, the generated magnetic field being capable of deflecting the charged particles attracted by the ion source so that the charged particles do not reach the ion source.

2. The device according to claim 1, wherein the generated magnetic field is capable of deflecting the charged particles so that they meet the wall of the extraction means instead of reaching the ion source by passing through the opening of the extraction means.

3. The device according to claim 1, wherein the means for generating a magnetic field is arranged at the opening of the extraction means.

4. The device according to claim 3, wherein the opening of the extraction means is formed in a recess of the extraction means, the means for generating a magnetic field being placed inside this recess, on the edge of said opening.

5. The device according to claim 1, wherein the means for generating a magnetic field comprises at least one permanent magnet.

6. The device according to claim 5, wherein the means for generating a magnetic field is composed of two permanent magnets facing one another.

7. The device according to claim 6, wherein the two permanent magnets together define an air gap that is preferably adjustable between about 2 to about 4 mm.

8. The device according to claim 7, wherein the magnetic field induced by the two permanent magnets in the air gap is of the order of 0.1 to 1 Tesla.

9. The device according to claim 1, wherein the ion extraction means is an extraction electrode surrounding the ion source.

10. The device according to claim 1, wherein the ion source is surrounded by a cryogenic trap held at low temperature, this cryogenic trap being capable of trapping volatile chemical species by condensation before they are able to reach the ion source.

11. The device according to claim 10, wherein the cryogenic trap is held at a low temperature by:
 circulation or accumulation of a cryogenic fluid, the cryogenic fluid preferably being liquid nitrogen; or
 a mechanical refrigerator generating a low emission of vibrations; or
 an electric refrigerator.

12. The device according to claim 10, wherein the cryogenic trap is held at a temperature below 100 K.

13. The device according to claim 10, wherein the cryogenic trap comprises a sheath with two open ends surrounding the ion source.

14. The device according to claim 13, wherein the cryogenic trap comprises a coiled tube with cryogenic fluid, wound around the sheath.

15. The device according to claim 13, wherein one of the open ends of the sheath is used for passing of the ion beam produced by the ion source.

16. The device according to claim 13, wherein the sheath is formed by a wall of revolution, this wall comprising a first section of cylindrical shape and a second section of frusto-conical shape.

17. The device according to claim 10, wherein the cryogenic trap surrounds both the ion source and the extraction means.

18. The device according to claim 1, wherein the liquid metal ion source comprises a conductive rod ending in a tip, a reservoir attached to the rod and used to collect a source metal to be liquefied, and a conductive filament comprising windings through which the tip of the rod passes.

19. A focused ion beam installation comprising:
 a work chamber containing a sample holder and an inlet for reagent gases in the vicinity of the sample holder; and
 a column with several levels, including a first level for generating an ion beam and a second level for guiding and focusing the ion beam, an installation in which the first level comprises a device according to claim 1.

20. A device for generating an ion beam, comprising:
 a support;
 an ion source, comprising one lower end connected to the support and an upper end opposite the lower end;
 means for extracting the ions emitted by the source, this extraction means comprising a wall provided with an opening, the opening being arranged in the vicinity of the upper end of the ion source, to allow the extracted ions to pass through this opening; and
 means for the generation of a magnetic field capable of generating a magnetic field at the opening of the extraction means, the generated magnetic field being capable of deflecting charged particles attracted by the ion source so that the charged particles do not reach the ion source;
 wherein the means for generating the magnetic field is arranged at the opening of the extraction means; and
 wherein the opening of the extraction means is formed in a recess of the extraction means, the means for generating the magnetic field being placed inside this recess, on the edge of said opening.

21. A device for generating an ion beam, comprising:
 a support;
 an ion source, comprising one lower end connected to the support and an upper end opposite the lower end;
 means for extracting the ions emitted by the source, this extraction means comprising a wall provided with an opening, the opening being arranged in the vicinity of the upper end of the ion source, to allow the extracted ions to pass through this opening; and
 means for the generation of a magnetic field capable of generating a magnetic field at the opening of the extraction means, the generated magnetic field being capable of deflecting charged particles attracted by the ion source so that the charged particles do not reach the ion source;
 wherein the means for generating the magnetic field comprises at least one permanent magnet;
 wherein the means for generating the magnetic field is composed of two permanent magnets facing one another; and
 wherein the two permanent magnets together define an air gap that is preferably adjustable between about 2 to about 4 mm.

* * * * *